(12) United States Patent
Zhang et al.

(10) Patent No.: US 9,831,313 B2
(45) Date of Patent: Nov. 28, 2017

(54) METHOD TO THIN DOWN INDIUM PHOSPHIDE LAYER

(71) Applicants: Semiconductor Manufacturing International (Beijing) Corporation, Beijing (CN); Semiconductor Manufacturing International (Shanghai) Corporation, Shanghai (CN)

(72) Inventors: Haiyang Zhang, Shanghai (CN); Chenglong Zhang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/236,189

(22) Filed: Aug. 12, 2016

(65) Prior Publication Data
US 2017/0062571 A1  Mar. 2, 2017

(30) Foreign Application Priority Data
Aug. 26, 2015 (CN) .......................... 2015 1 0531734

(51) Int. Cl.
*H01L 29/205* (2006.01)
*H01L 29/66* (2006.01)
*H01L 21/02* (2006.01)
*H01L 21/306* (2006.01)
*H01L 29/78* (2006.01)

(52) U.S. Cl.
CPC ...... *H01L 29/205* (2013.01); *H01L 21/02543* (2013.01); *H01L 21/30621* (2013.01); *H01L 29/66522* (2013.01); *H01L 29/66795* (2013.01); *H01L 29/7851* (2013.01)

(58) Field of Classification Search
None
See application file for complete search history.

(56) References Cited

U.S. PATENT DOCUMENTS 2,676,112 A * 4/1954 Middleton ......... C09K 11/0805
                                                        252/301.36
5,111,265 A * 5/1992 Tanaka ................ H01L 29/7376
                                                        257/198

(Continued)

*Primary Examiner* — Lex Malsawma
(74) *Attorney, Agent, or Firm* — Anova Law Group, PLLC

(57) ABSTRACT

The disclosed subject matter provides a Fin-FET with a thinned-down InP layer and thinning-down method thereof. In a Fin-FET, the fin structure is made of InGaAs and an InP layer is formed to cover the fin structure. The InP layer is obtained from an initial InP layer formed on the fin structure through a thinning down process including converting a surface portion of the InP layer into a Phosphorus-rich layer and removing the Phosphorus-rich layer. The thickness of the ultimately-formed InP layer is less than or equal to 1 nm. According to the disclosed method, the InP layer in the Fin-FET may be easily thinned down, and during the thinning-down process, contamination may be avoided.

16 Claims, 4 Drawing Sheets

(56) References Cited

U.S. PATENT DOCUMENTS

| | | | | |
|---|---|---|---|---|
| 5,189,309 A * | 2/1993 | Wada | ................ | H01L 31/03046 |
| | | | | 257/185 |
| 5,616,947 A * | 4/1997 | Tamura | ............ | H01L 21/28264 |
| | | | | 257/289 |
| 6,287,946 B1 * | 9/2001 | Micovic | ................ | B82Y 15/00 |
| | | | | 257/E21.172 |
| 2002/0127758 A1 * | 9/2002 | Dagenais | ............... | B82Y 20/00 |
| | | | | 438/46 |
| 2003/0066817 A1 * | 4/2003 | Tanabe | ................ | H01J 37/321 |
| | | | | 216/68 |
| 2004/0053506 A1 * | 3/2004 | Lee | .................. | H01L 21/30621 |
| | | | | 438/718 |
| 2006/0178000 A1 * | 8/2006 | Takakusaki | ............ | C30B 23/02 |
| | | | | 438/604 |
| 2008/0224183 A1 * | 9/2008 | Nawaz | ............. | H01L 29/66795 |
| | | | | 257/279 |
| 2009/0057719 A1 * | 3/2009 | Takahashi | .......... | H01L 29/0649 |
| | | | | 257/194 |
| 2010/0163926 A1 * | 7/2010 | Hudait | ............... | H01L 29/1054 |
| | | | | 257/190 |
| 2013/0043214 A1 * | 2/2013 | Forrest | ............... | H01L 31/1896 |
| | | | | 216/95 |

\* cited by examiner

METHOD TO THIN DOWN INDIUM PHOSPHIDE LAYER

CROSS-REFERENCES TO RELATED APPLICATIONS

This application claims the priority of Chinese Patent Application No. CN201510531734.7, filed on Aug. 26, 2015, the entire content of which is incorporated herein by reference.

FIELD OF THE DISCLOSURE

The present disclosure generally relates to the field of semiconductor fabrication technology and, more particularly, relates to a method to thin down an InP layer during the fabrication of a Fin-FET.

BACKGROUND

With the development of the semiconductor integrated circuit (IC) technology, the critical dimension of semiconductor devices also continuously becomes smaller. For conventional metal-oxide-semiconductor (MOS) field-effect transistors (FET), such a small critical dimension may lead to the short-channel effect as well as other disadvantages. With a relatively large channel, Fin-FET may overcome the short-channel effect and, thus, has been widely used. However, for Fin-FET with a fin structure made of Si, when the critical dimension shrinks to approach 16 nm, the carrier mobility in the channel may be low due to low mobility of electrons in Si, leading to a relatively small drive current and high energy consumption for the Fin-FET. Therefore, a material with higher electron mobility may be required to replace Si for fabricating the fin structure.

Certain technology is developed to use a Fin-FET with the fin structure made of III-V group elements (such as InGaAs). Because of the low energy consumption characteristics, the III-V group elements provide higher carrier mobility. However, when the critical dimension further decreases to 7 nm or even 5 nm, lower energy consumption of the Fin-FET may be required.

The Fin-FET can also have the fin structure made of InGaAs and covered by an InP layer. Because the lattice mismatch between the InP layer and InGaAs is small while the electron saturation velocity is high, the Fin-FET may demonstrate characteristics of low energy consumption. However, due to the limitation of process conditions, an InP layer formed by existing methods is usually thick. A thick InP layer may not be good for heat dispersion. In addition, such a thick InP layer may also require a relatively large drive voltage. Therefore, the InP layer may need to be thinned down to approach a thickness equal to or less than 1 nm.

Currently, a method for thinning down the InP layer often includes performing an ashing process on the InP layer using oxygen gas and then performing a wet etching process at room temperature to remove the ashed portion of the InP layer. An etch solution mixed by diluted sulfuric acid and water at a 1:1 ratio may be used during the wet etching process.

However, the wet etching process may introduce some contaminants, which may affect the performance of the device. In addition, as the device may need to be alternatively handled in dry and wet operation environments, the fabrication process may be more complicated, the processing time may be longer, and the probability of getting the device contaminated may also increase.

The disclosed fabrication methods and 3D transistors are directed to solve one or more problems set forth above and other problems in the art.

BRIEF SUMMARY OF THE DISCLOSURE

One aspect of the present disclosure includes a method for thinning down InP layer. The method includes providing a fin structure, wherein the fin structure is made of InGaAs, forming an InP layer to cover the fin structure, converting a surface portion of the InP layer into a Phosphorus-rich layer, and removing the Phosphorus-rich layer. After removing the Phosphorus-rich layer, the remaining portion of the InP layer becomes a thinned-down InP layer with a thickness less than or equal to 1 nm.

Another aspect of the present disclosure provides a Fin-FET. The Fin-FET includes a fin structure formed on a semiconductor substrate. The fin structure is made of InGaAs. The Fin-FET further includes an InP layer formed on the fin structure with a thickness less than or equal to 1 nm. The InP layer is obtained from an initial InP layer formed on the fin structure through a thinning down process including converting a surface portion of the InP layer into a Phosphorus-rich layer and removing the Phosphorus-rich layer. The Fin-FET also includes a dielectric layer formed on the InP layer and a gate electrode formed on the dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described in above background section, existing methods to thin down an InP layer formed on an InGaAs fin structure usually includes performing an ashing process on the InP layer using oxygen gas and then performing a wet etching process at room temperature to remove the ashed portion of the InP layer. During the wet etching process, an etch solution mixed by diluted sulfuric acid and water at a 1:1 ratio may be used. However, the wet etching process may introduce some contaminants, which may affect the performance of the device. In addition, as the device may need to be alternatively handled in dry and wet operation environments, the fabrication process may be more complicated, the processing time may be longer, and the probability of getting the device contaminated may also increase.

Figure 1:
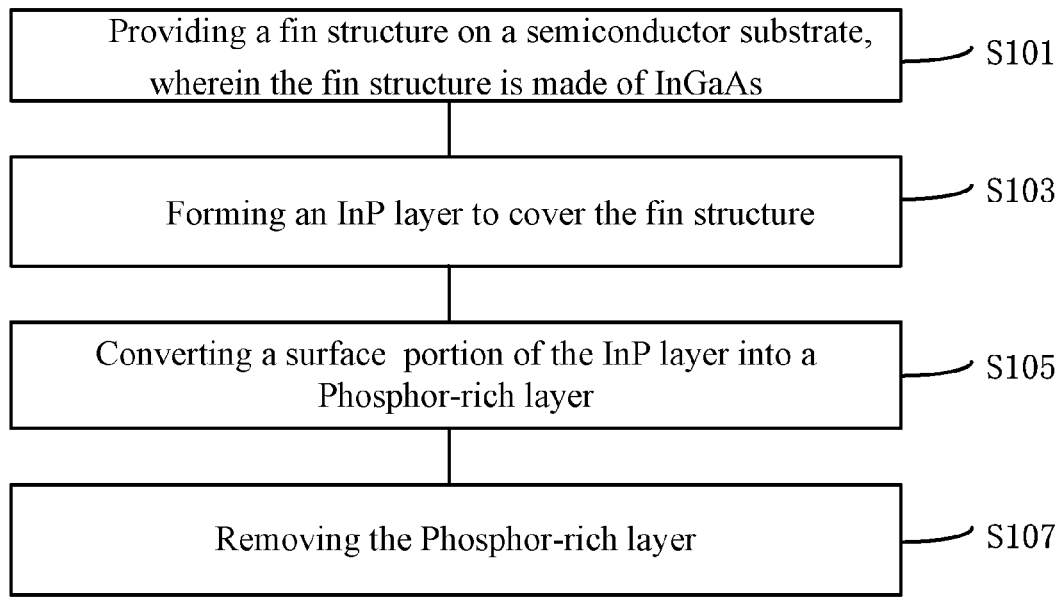
FIG. 1 illustrates a flowchart of an exemplary fabrication process consistent with disclosed embodiments.

Accordingly, the present disclosure provides an improved method to thin down the InP layer formed on the InGaAs fin structure. FIG. 1 shows a flowchart of an exemplary fabrication process consistent with various disclosed embodiments. FIGS. 2-7 show schematic views of the structures corresponding to certain stages of the exemplary fabrication method illustrated in FIG. 1.

Figure 2:
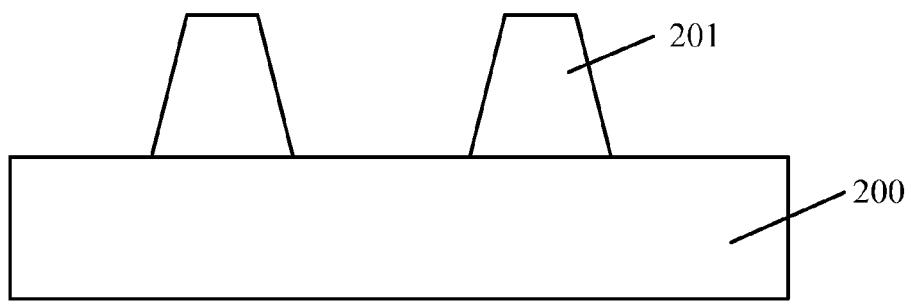
FIGS. 2-7 illustrate schematic views of semiconductor structures corresponding to certain stages of another exemplary fabrication method consistent with disclosed embodiments.

Referring to FIG. 1, at the beginning of the fabrication process, a plurality of fin structures formed on a semiconductor substrate is provided (S101). FIG. 2 shows a schematic cross-section view of the semiconductor substrate, the active region, and the two isolation structures.

Referring to FIG. 2, a semiconductor substrate 200 is provided. A plurality of fin structures 201 made of InGaAs is formed on the semiconductor substrate 200.

The semiconductor substrate 200 may have a single-layer structure or a multiple-layer structure. When the semiconductor substrate 200 has a single-layer structure, the semiconductor substrate 200 may be made of one of Si, Ge, SiGe, SiC, GaN, etc. When the semiconductor substrate 200 has a multiple-layer structure, the semiconductor substrate 200 may include a semiconductor layer (not shown) and one or more interlayer dielectric layers (not shown) formed on the surface of the semiconductor layer.

The plurality of fin structures 201 may be made of InGaAs. InGaAs is a III-V group compound and has characteristics of low energy consumption. Therefore, the carrier mobility in the fin structures 201 may be improved.

The cross-section of each fin structure along a direction perpendicular to the elongation direction of the fin structure may be a rectangle, a trapezoid, or a combination of rectangle and trapezoid. In one embodiment, the cross-section of each fin structure along a direction perpendicular to the elongation direction of the fin structure is a trapezoid. The plurality of fin structures 201 may be fabricated on the semiconductor substrate 200 by any appropriate method known in the field.

Figure 3:
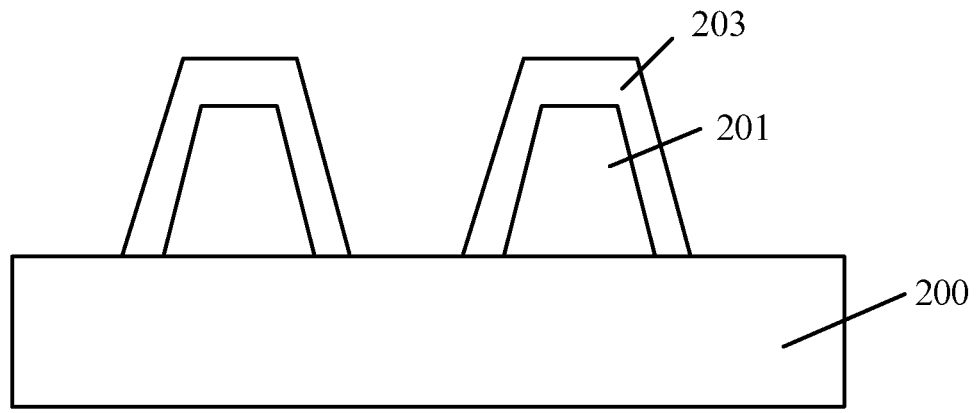

Further, returning to FIG. 1, an InP layer may be formed on the fin structures (S103). FIG. 3 shows a schematic cross-section view of the corresponding semiconductor structure.

Referring to FIG. 3, an InP layer 203 may be formed to cove the fin structures 201. The InP layer 203 may be formed by any appropriate method know in the field and no specific restriction is required. For example, the InP layer 203 may be formed by a physical vapor deposition method such as plasma sputtering, molecular beam epitaxy (MBE), e-beam evaporation, pulsed-laser deposition, magnetron sputtering, etc. In addition, in certain embodiments, a metal organic chemical vapor deposition (MOCVD) method may also be adopted to form the InP layer 203. Due to the limitation of the processing conditions, the thickness of the InP layer formed by above methods may be at least several tens of nanometers.

In one embodiment, the InP layer is formed by an MOCVD method and the thickness of the InP layer 203 is 30 nm. In a subsequent process, the thickness of the InP layer may be reduced in order to reach a relatively thin InP layer.

Figure 4:
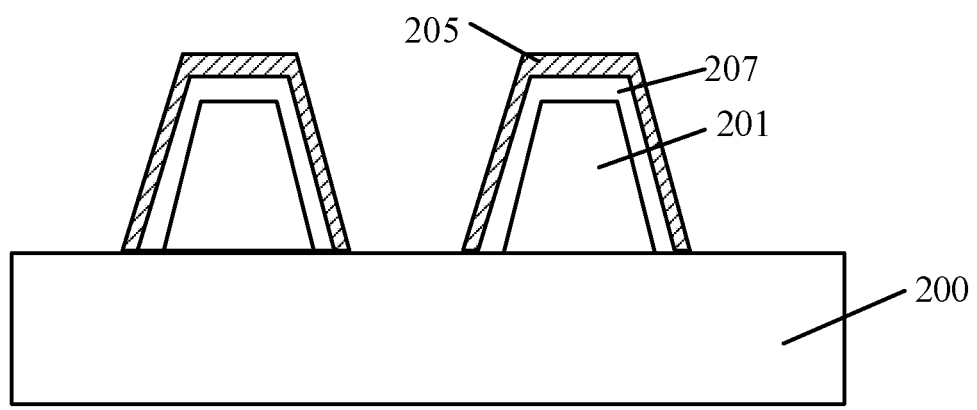

Further, returning to FIG. 1, a surface portion of the InP layer may be converted into a Phosphorus-rich layer (S105). FIG. 4 shows a schematic cross-section view of the corresponding semiconductor structure.

Referring to FIG. 4, a surface portion of the InP layer 203 (referring to FIG. 3) formed on the fin structure 201 may be converted into a Phosphorus-rich layer 205. The Phosphorus-rich layer 205 may be formed by a dry etching process.

The dry etching process may use an etch gas including $Cl_2$ and Ar. During the dry etching process, a portion of the indium atoms near the surface of the InP layer 203 (referring to FIG. 3) may be removed. Thus, with a major ingredient of Phosphorus, the remained surface portion becomes the Phosphorus-rich layer 205. The thickness of the Phosphorus-rich layer 205 after the dry etching process may be less than 1 nm. The portion of the InP layer 203 (referring to FIG. 3) not affected by the dry etching process, i.e., the ultimately-formed InP layer after the thinning-down process, is labeled as 207.

In one embodiment, the dry etching process to convert the surface portion of the InP layer 203 may be a chemical dry etching process. The process parameters for the chemical dry etching process may include a process temperature in a range of −10 to 200° C., a process pressure in a range of 5 to 500 mTorr, a power in a range of 100 to 1000 W, a flow rate of $Cl_2$ in a range of 10 to 200 sccm, and a flow rate of Ar in a range of 10 to 500 sccm. The process conditions for such a chemical dry etching process may be mild so that damages to the surface of the unconverted InP layer, i.e., the ultimately-formed InP layer 207, during the thinning-down process may be reduced, which further ensures that the performance of the Fin-FET is not affected.

Figure 5:
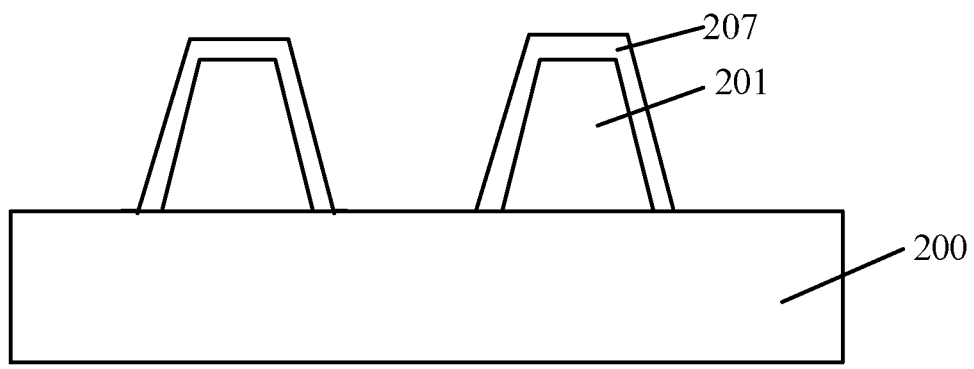

Further, returning to FIG. 1, the Phosphorus-rich layer may be removed (S107). FIG. 5 shows a schematic cross-section view of the corresponding semiconductor structure.

Referring to FIG. 5, the Phosphorus-rich layer 205 is removed. The Phosphorus-rich layer 205 may be removed by a dry etching process. The dry etching process may use HBr as an etch gas. During the dry etching process, the Phosphorus-rich layer 205 is gradually removed and only the unconverted portion of the InP layer, i.e., the ultimately-formed InP layer 207, remains. As such, the goal to thin down the InP layer 203 may be reached.

In one embodiment, the dry etching process to remove the Phosphorus-rich layer 205 is a chemical dry etching process. The process parameters for the chemical dry etching process may include a process pressure in a range of 5 to 500 mTorr, a power in a range of 100 to 1000 W, and a flow rate of HBr in a range of 50 to 500 sccm. The process conditions for such a chemical dry etching process may be mild so that damages to the surface of the unconverted InP layer, i.e. the ultimately-formed InP layer 207, during the thinning-down process may be reduced, which further ensures that the performance of the Fin-FET is not affected.

In other embodiments, the chemical dry etching process to form the Phosphorus-rich layer 205 using $Cl_2$ and Ar as an etch gas and the subsequent chemical dry etching process to remove the Phosphorus-rich layer 205 using HBr as an etch gas may be performed multiple times in order to obtain a desired thickness for the ultimately-formed InP layer 207. During the dry etching process to form the Phosphorus-rich layer 205, the process temperature and the flow rate of Ar may directly affect the etching rate. Specifically, with a higher process temperature, the etching rate may be higher; while with a higher flow rate of Ar, the etching rate may also be higher. In addition, during each HBr etching process, the thickness of the removed Phosphorus-rich layer 205 may be less than 1 nm.

The thickness if the ultimately-formed Inp layer 207 after being thinned down may not be greater than 1 nm. When the thickness of the Inp layer is equal to or less than 1 nm, the heat dissipation effect may be desired while the required drive voltage is also relatively small.

Figure 6:
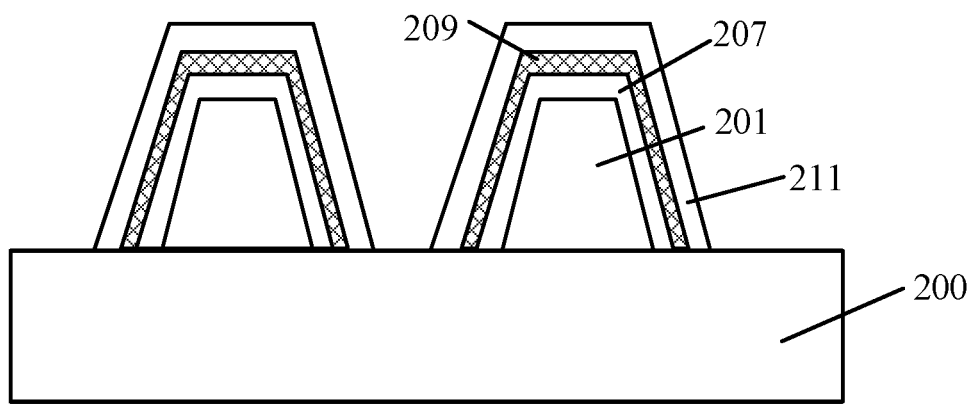

The fabrication method may further include forming a dielectric layer on the surface of each fin structure and a gate electrode on the dielectric layer to complete Fin-FET structures. FIG. 6 shows a schematic cross-section view of the corresponding semiconductor structure.

Referring to FIG. 6, a gate structure may be formed on the thinned-down Inp layer 207. The gate structure may across the whole length of the corresponding fin structure 201. Specifically, the gate structure includes a dielectric layer 209 formed on the thinned-down Inp layer 207 and a gate electrode 211 formed on the dielectric layer 209. The gate structures may be formed by any appropriate method know in the field.

Figure 7:
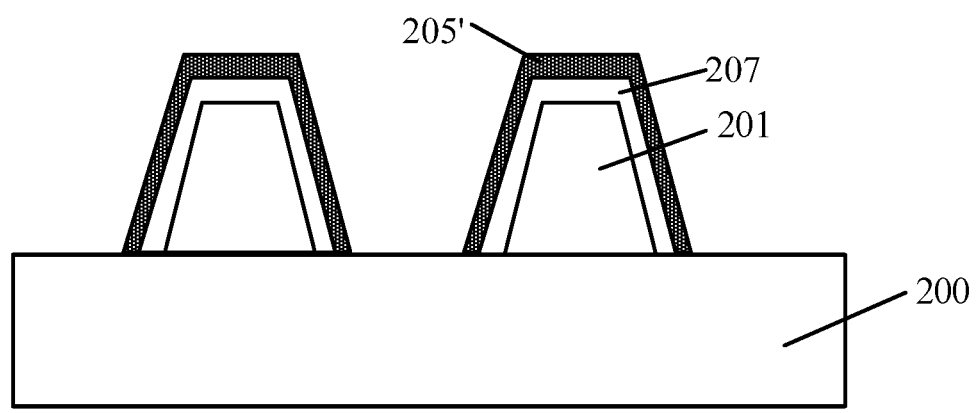

In certain other embodiments, the Phosphorus-rich layer 205 may be removed by a method different from the HBr chemical dry etching process described above. For example, the Phosphorus-rich layer 205 may be removed by an oxygen treatment process followed by a $H_2$ dry etching process. Specifically, the Phosphorus-rich layer 205 may be treated by $O_2$ and then the $O_2$-treated Phosphorus-rich layer may be removed by a $H_2$ dry etching process. FIG. 7 shows a schematic cross-section view of the corresponding semiconductor structure after the oxygen treatment process.

Referring to FIG. 7, an $O_2$-treated Phosphorus-rich layer 205' is formed by using $O_2$ to treat the Phosphorus-rich layer 205. A hydrogen dry etching process is then preformed to remove the $O_2$-treated Phosphorus-rich layer 205' and obtain a thinned-down InP layer. As such, the goal to thin down the InP layer 203 may be reached.

The oxygen treatment and the hydrogen dry etching are both chemical dry etching process. The process parameters for the oxygen treatment process may include a process pressure in a range of 5 to 500 mTorr, a power in a range of 100 to 1000 W, and a flow rate of $O_2$ in a range of 10 to 200 sccm. The process parameters for the chemical dry etching process to remove the $O_2$-treated Phosphorus-rich layer 205' may include a process pressure in a range of 5 to 500 mTorr, a power in a range of 100 to 1000 W, and a flow rate of $H_2$ in a range of 50 to 500 sccm. The process conditions for chemical dry etching processes may be mild so that damages to the surface of the unconverted InP layer, i.e. the ultimately-formed InP layer 207, during the thinning-down process may be reduced, which further ensures that the performance of the Fin-FET is not affected.

In certain other embodiments, the process to form a Phosphorus-rich layer and the subsequent process to remove the Phosphorus-rich layer may need to be repeated n times with n no less than 2. When Ar is used to form a Phosphorus-rich layer, the process temperature and the flow rate of Ar may directly affect the etching rate. Specifically, with a higher process temperature, the etching rate may be higher; while with a higher flow rate of Ar, the etching rate may also be higher. In addition, during each oxygen treatment process and the following $H_2$ dry etching process, the thickness of the removed Phosphorus-rich layer 205 may be less than 1 nm.

Therefore, the etched thickness may be controlled by adjusting the process temperature, the Ar flow rate, and the etching time. When the Phosphorus-rich layer formed each time is thinner, the process to form and remove Phosphorus-rich layer may need to be repeated more times; in the meantime, the thickness of the ultimately thinned-down InP layer may also be more precisely controlled and damage to the surface of the thinned-down InP layer may also be reduced. In one embodiment, the thickness of the Phosphorus-rich layer formed each time is smaller than 1 nm.

According to the disclosed methods, a surface portion of the InP layer formed on the fin structure may be converted into a Phosphorus-rich layer in order to reduce the thickness of the InP layer. The Phosphorus-rich layer may be easily removed, and during the removal process, contaminations may not be induced.

Further, the Phosphorus-rich layer may be removed by a dry etching process. During the etching process, contaminations may be less. In addition, using a dry etching process to remove the Phosphorus-rich layer may also reduce alternation of dry and wet operation environments for the device. Therefore, the processing time may be reduced, and the probability of getting the device contaminated may also decrease.

Further, according to the disclosed methods, the dry etching process to form or remove the Phosphorus-rich layer is a chemical dry etching process. For such a chemical dry etching process, the process conditions may be mild so that damages to the devices may be reduced.

Further, according to the disclosed methods, the process to form Phosphorus-rich layer and the process to remove Phosphorus-rich layer may be repeated multiple times. Therefore, controllability of process engineering may be increased, which further ensures the performance of the device.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for thinning down an InP layer formed on a fin structure, comprising:
   providing a fin structure, wherein the fin structure is made of InGaAs;
   forming an InP layer to cover the fin structure;
   converting a surface portion of the InP layer into a Phosphorus-rich layer; and
   removing the Phosphorus-rich layer, wherein a remaining portion of the InP layer becomes a thinned-down InP layer.

2. The method for thinning down the InP layer according to claim 1, after removing the Phosphorus-rich layer, further including:
   forming a dielectric layer to cover the thinned-down InP layer; and
   forming a gate electrode on the dielectric layer.

3. The method for thinning down the InP layer according to claim 1, wherein the Phosphorus-rich layer is formed by a dry etching process using an etch gas including $Cl_2$ and Ar.

4. The method for thinning down the InP layer according to claim 3, wherein the dry etching process to form the Phosphorus-rich layer is a chemical dry etching process.

5. The method for thinning down the InP layer according to claim 4, wherein process parameters of the chemical dry etching process to form the Phosphorus-rich layer include:
   a process temperature in a range of −10 to 200° C.;
   a process pressure in a range of 5 to 500 mTorr;
   a power in a range of 100 to 1000 W;
   a flow rate of $Cl_2$ in a range of 10 to 200 sccm; and
   a flow rate of Ar in a range of 10 to 500 sccm.

6. The method for thinning down the InP layer according to claim 1, wherein the Phosphorus-rich layer is removed by a dry etching process using HBr as an etch gas.

7. The method for thinning down the InP layer according to claim 6, wherein the dry etching process to remove the Phosphorus-rich layer is a chemical dry etching process.

8. The method for thinning down the InP layer according to claim 7, wherein process parameters of the chemical dry etching process to remove the Phosphorus-rich layer include:
- a process pressure in a range of 5 to 500 mTorr;
- a power in a range of 100 to 1000 W; and
- a flow rate of HBr in a range of 50 to 500 sccm.

9. The method for thinning down the InP layer according to claim 1, wherein the Phosphorus-rich layer is removed by a method including:
- performing an oxygen treatment process on the Phosphorus-rich layer; and
- removing the oxygen-treated Phosphorus-rich layer by a dry etching process using $H_2$ as an etch gas.

10. The method for thinning down the InP layer according to claim 9, wherein the oxygen treatment process is a chemical dry etching process.

11. The method for thinning down the InP layer according to claim 10, wherein process parameters of the chemical dry etching process to treat the Phosphorus-rich layer with oxygen include:
- a process pressure in a range of 5 to 500 mTorr;
- a power in a range of 100 to 1000 W; and
- a flow rate of $O_2$ in a range of 10 to 200 sccm.

12. The method for thinning down the InP layer according to claim 9, wherein the dry etching process to remove the oxygen-treated Phosphorus-rich layer is a chemical dry etching process.

13. The method for thinning down the InP layer according to claim 12, wherein process parameters of the chemical dry etching process to remove the oxygen-treated Phosphorus-rich layer include:
- a process pressure in a range of 5 to 500 mTorr;
- a power in a range of 100 to 1000 W; and
- a flow rate of $H_2$ in a range of 50 to 500 sccm.

14. The method for thinning down the InP layer according to claim 1, wherein the process to form a Phosphorus-rich layer and the process to remove the formed Phosphorus-rich layer are repeated at least 2 times.

15. The method for thinning down the InP layer according to claim 14, wherein after performing each process to form a Phosphorus-rich layer, a thickness of the Phosphorus-rich layer is less than 1 nm.

16. The method for thinning down the InP layer according to claim 1, wherein a thickness of the ultimately thinned-down InP layer is smaller than or equal to 1 nm.

* * * * *